(12) United States Patent
Yoneda

(10) Patent No.: US 7,405,461 B2
(45) Date of Patent: Jul. 29, 2008

(54) SEMICONDUCTOR DEVICE AND METHOD FOR MANUFACTURING SEMICONDUCTOR DEVICE

(75) Inventor: Haruki Yoneda, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/220,420

(22) Filed: Sep. 7, 2005

(65) Prior Publication Data

US 2006/0051932 A1     Mar. 9, 2006

(30) Foreign Application Priority Data

Sep. 8, 2004   (JP) .............................. 2004-261389
Aug. 31, 2005  (JP) .............................. 2005-250694

(51) Int. Cl.
*H01L 29/00*   (2006.01)

(52) U.S. Cl. ............... 257/510; 438/452; 257/E21.548; 257/E21.55; 257/E21.585

(58) Field of Classification Search ................ 257/523, 257/647, 510, 622, E21.545, E21.548, E21.549, 257/E21.55, E21.585; 438/218, 221, 294, 438/296, 359–361, 400, 424–427, 430, 435, 438/452

See application file for complete search history.

(56) References Cited

U.S. PATENT DOCUMENTS

| | | | | | |
|---|---|---|---|---|---|
| 5,578,518 | A | * | 11/1996 | Koike et al. | 438/424 |
| 5,837,612 | A | * | 11/1998 | Ajuria et al. | 438/697 |
| 2003/0017710 | A1 | * | 1/2003 | Yang et al. | 438/718 |

FOREIGN PATENT DOCUMENTS

| | | |
|---|---|---|
| JP | 9-8119 A | 1/1997 |
| JP | 3382063 B2 | 12/2002 |

* cited by examiner

*Primary Examiner*—Quoc Hoang
(74) *Attorney, Agent, or Firm*—McDermott Will & Emery LLP

(57) ABSTRACT

A highly reliable semiconductor device that controls both defects and impurity diffusion and a method for manufacturing such a semiconductor device. An $N^+$ embedment layer and an N-type epitaxial layer are formed on a main surface region of a P-type silicon substrate. An STI trench is formed in the N-type epitaxial layer. A thermal oxidation film is formed on the inner surface of the STI trench. The STI trench is filled with an HDP-NSG film. A deep trench is formed in the STI trench with a depth reaching the silicon substrate. A further thermal oxidation film is formed on the inner surface of the deep trench. The thermal oxidation film of the deep trench is thinner than that of the STI trench. A silicon oxidation film is also formed in the deep trench and filled with a polysilicon film.

9 Claims, 6 Drawing Sheets

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from prior Japanese Patent Applications No. 2004-261389, filed on Sep. 8, 2004, and No. 2005-250694, filed on Aug. 31, 2005, the entire contents of which are incorporated herein by reference.

BACKGROUND OF THE INVENTION

The present invention relates to a semiconductor device and a method for manufacturing a semiconductor device, and more particularly, to a semiconductor including an element isolating region and a method for manufacturing such a semiconductor device.

In a semiconductor device of the prior art, an element such as a bipolar transistor is formed by performing an element isolation process. Such a bipolar transistor is formed on a substrate with an embedment layer having a high impurity concentration. Known element isolation processes include isolation of elements with a field oxidation film, which is formed by performing local oxidation of silicon (LOCOS), and formation of a deep trench to isolate a high concentration impurity layer in a substrate. When a field oxidation film is formed by performing LOCOS, in addition to the flatness of the surface of an element isolating region decreasing, the area of the element isolating region is increased due to a "bird's beak" that occurs during the formation of the field oxidation film. This makes it difficult to further miniaturize such a semiconductor device.

Accordingly, Japanese Patent No. 3382063 proposes shallow trench isolation (STI) that enables the formation of a flat and miniaturized element isolating region.

FIG. 14 is a cross-sectional view showing a semiconductor device including an element isolating region formed by performing STI in the prior art. In FIG. 14, an N$^+$ embedment layer 102 and an N-type epitaxial silicon layer 103 are formed on a silicon substrate 101. An STI trench is formed in the N-type epitaxial silicon layer 103. An insulative film 104 is formed on the inner surface of the STI trench. The STI trench is filled with an embedment film 105. A deep trench formed in the STI trench has a depth reaching the silicon substrate 101. An insulative film 106 is formed on the inner surface of the STI trench. The deep trench is further filled with an embedment film 107.

In the STI technique of the prior art, each corner in the STI trench and the deep trench (opening edge 200a of the STI trench, bottom edge 200b of the STI trench, boundary edge 200c between the STI trench and the deep trench, and bottom edge 200d of the deep trench) is rounded. Further, the insulative films 104 and 106 have about the same thicknesses.

The rounded corners (200a, 200b, 200c, and 200d) of the STI trench and the deep trench prevent the concentration of stress, which results from the shape of the element isolation structure, from causing defects. However, when forming a further miniaturized semiconductor device, heat treatment, which is performed when forming an insulative film on the inner surface of the STI trench or deep trench, may diffuse impurities from the N$^+$ embedment layer 102 to positions close to the surface. This would deteriorate the transistor characteristics.

When the N$^+$ embedment layer 102 is exposed from the deep trench, the impurities of the N$^+$ embedment layer 102 is diffused outwards through the deep trench. This would lower the concentration of the impurities in the N$^+$ embedment layer 102 and increase the collector resistance. Thus, when forming an insulative layer on the inner surface of the STI trench and on the inner surface of the deep trench, the prevention of defects resulting from the corners in the STI and deep trenches and the prevention of impurity diffusion from the N$^+$ embedment layer 102 must both be performed at the same time.

In the element isolation structure of the prior art STI technique, the thicknesses of the insulative film on the inner surfaces of the STI trench and the deep trench are about the same. Thus, when preventing the occurrence of defects near the STI trench while rounding the corners of the deep trench, the heat treatment for forming the insulative layer on the inner surface of the deep trench increases the diffusion of impurities from the N$^+$ embedment layer 102. When preventing the diffusion of impurities from the N$^+$ embedment layer 102 during the formation of the insulative film on the inner surface of the deep trench, the corners, especially, those of the STI trench, cannot be sufficiently rounded. Thus, the occurrence of defects cannot be prevented. The corners of the STI trench are covered by the insulative film during the formation of an insulative film on the inner surface of the deep trench. Thus, it would be difficult for stress to be released from such corners. In such a case, stress is accumulated at the corners when forming the insulative film on the inner surface of the deep trench. This would increase the tendency of a defect occurring at a corner of the STI trench.

SUMMARY OF THE INVENTION

It is an object of the present invention to provide a semiconductor device having high reliability that prevents the occurrence of defects while controlling the diffusion of impurities.

One aspect of the present invention is a method for manufacturing a semiconductor device. The method includes the steps of forming a first layer including impurities on a semiconductor substrate, forming a second layer on the first layer, forming a first trench in the second layer, the first trench including an inner surface having a corner, forming a first thermal oxidation film on the inner surface of the first trench by performing a first thermal oxidation process, forming a first embedment layer in the first trench, and forming a second trench in the first trench. The second trench includes an inner surface having a corner and being deeper than the first trench. The method also includes the steps of forming a second thermal oxidation film on the inner surface of the second trench by performing a second thermal oxidation process, and forming a second embedment film in the second trench. The step of forming a first thermal oxidation film includes rounding the corner of the first trench. The step of forming a second thermal oxidation film includes rounding the corner of the second trench and forming the second thermal oxidation film so as to be thinner than the first thermal oxidation film.

A further aspect of the present invention is a semiconductor device including an element isolating region and a semiconductor substrate. A first trench is formed in the element isolating region. The first trench includes an inner surface having a rounded corner. A first thermal oxidation film is formed on the inner surface of the first trench. A first embedment layer is formed in the first trench. A second trench is formed in the first trench and extends into the first embedment layer, the first thermal oxidation film, and the semiconductor substrate.

The second trench includes an inner surface having a rounded corner and is deeper than the first trench. A second thermal oxidation film is formed on the inner surface of the second trench and is thinner than the first thermal oxidation film. A second embedment film fills the second trench. An element region is isolated on the semiconductor substrate by the first trench and the second trench. A semiconductor element is formed on the element region.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor device according to a preferred embodiment of the present invention will now be discussed with reference to FIG. 1. The semiconductor device of FIG. 1 includes an element isolating region for defining an isolated element formation region 50.

Figure 1:
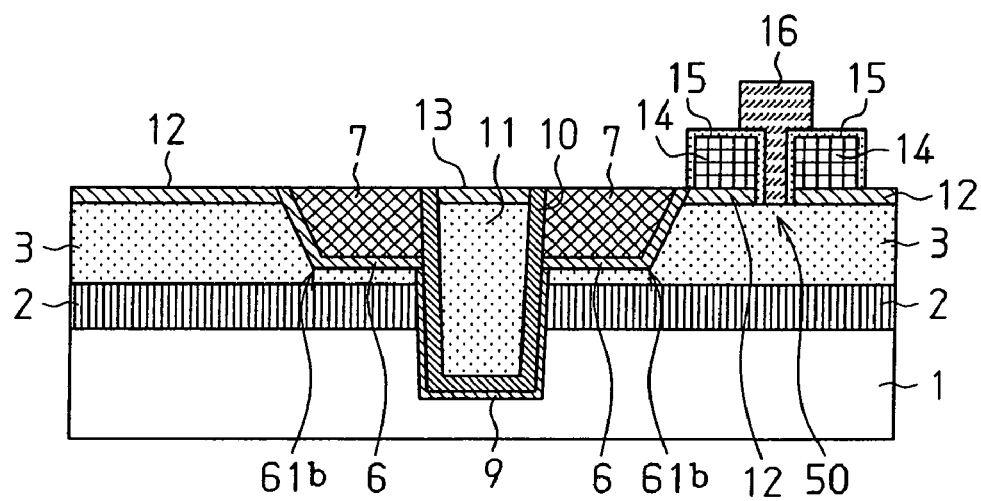
FIG. 1 is a cross-sectional view of a semiconductor device according to a preferred embodiment of the present invention.

In FIG. 1, an N$^+$ embedment layer 2 and an N-type epitaxial layer 3 are formed on a P-type silicon substrate 1. An STI trench 60 is formed in the N-type epitaxial layer 3 (refer to FIG. 4). A thermal oxidation film 6 is formed on the inner surface of the STI trench 60. The STI trench 60 is filled with a high-density plasma-nondoped silicate glass (HDP-NSG) film 7.

A deep trench 70 (refer to FIG. 7) is formed in the STI trench 60. In the preferred embodiment, the deep trench 70 extends through the middle portion of the STI trench 60. The deep trench 70 has a depth reaching the silicon substrate 1. A thermal oxidation film 9 is formed on the inner surface of the deep trench 70. The thermal oxidation film 9 is thinner than the thermal oxidation film 6 in the STI trench 60. A silicon oxidation film 10 is formed on the deep trench 70. The deep trench 70 is filled with a polysilicon film 11.

The N$^+$ embedment layer 2 and the N-type epitaxial layer 3 are respectively examples of first and second layers. The STI trench 60 is an example of a first trench. The deep trench 70 is an example of a second trench. The thermal oxidation film 6 is an example of a first thermal oxidation film. The thermal oxidation film 9 is an example of a second thermal oxidation film. The HDP-NSG film 7 is an example of a first embedment film. The polysilicon film 11 is an example of a second embedment film.

A silicon oxidation film 12 is formed on the upper surface of the N-type epitaxial layer 3. A trench cap layer 13, which is made of a silicon oxidation film, is formed on the upper surface of the polysilicon film 11.

Base electrodes 14, a silicon oxidation film 15 covering each base electrode 14, and a bipolar transistor (semiconductor element), which includes an emitter electrode 16, are formed on the element formation region 50.

A method for manufacturing the semiconductor device of the preferred embodiment will now be described with reference to FIGS. 2 to 12.

Figure 2:
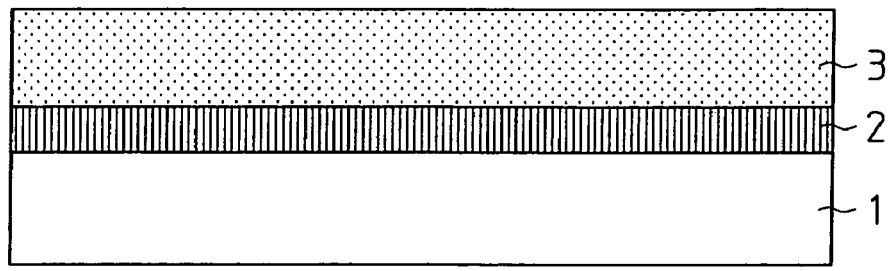
FIGS. 2 to 12 are cross-sectional views illustrating the procedures for manufacturing the semiconductor device of FIG. 1.

[First process, refer to FIG. 2] The N$^+$ embedment layer 2 is formed on a main surface of the P-type silicon substrate 1. Then, the N-type epitaxial layer 3 is formed on the N$^+$ embedment layer 2.

Figure 3:
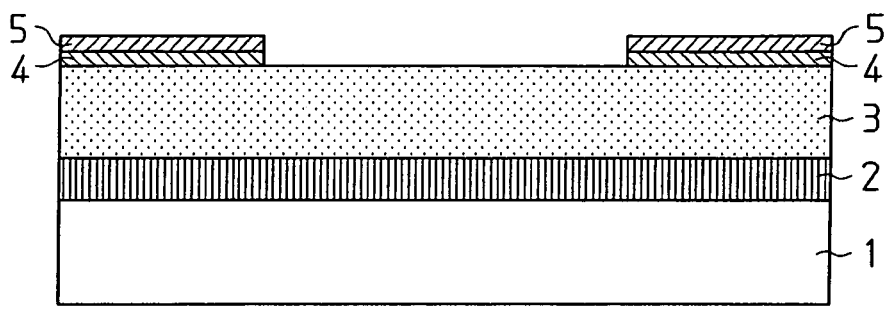

[Second process, refer to FIG. 3] Thermal oxidation is performed to form the silicon oxidation film 4 (thermal SiO$_2$ film), having a thickness of approximately 10 nm, on the N-type epitaxial layer 3. Then, a silicon nitride film (Si$_3$N$_4$ film) 5 having a thickness of approximately 100 nm is formed on the silicon oxidation film 4. The silicon nitride film 5 functions as a stopper film during chemical mechanical polishing (CMP) shown in FIG. 10. Lithography is performed to form a resist pattern mask on the silicon nitride film 5. Dry etching is then performed with the resist pattern mask to partially remove the silicon nitride film 5 and the silicon oxidation film 4.

Figure 4:
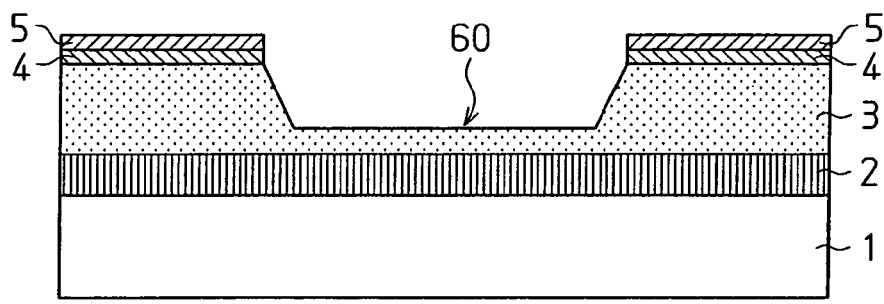

[Third process, refer to FIG. 4] Dry etching is performed using the silicon oxidation film 4 and the silicon nitride film 5 as a mask to partially remove the N-type epitaxial layer 3 and form the STI trench 60. The etching depth of the N-type epitaxial layer 3 is adjusted to, for example, approximately 500 nm.

Figure 5:
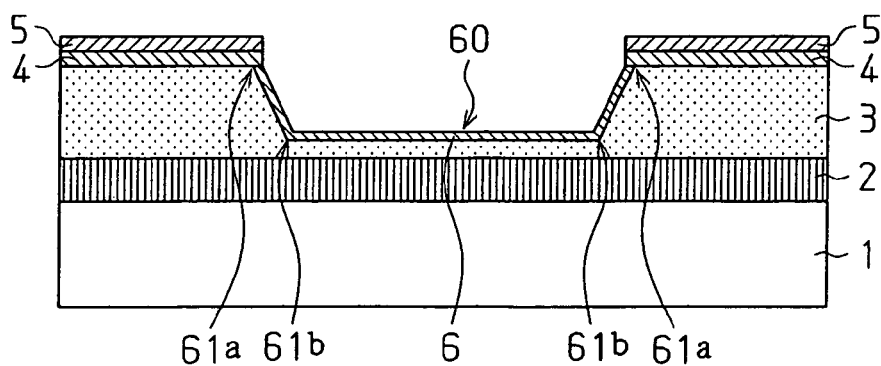

[Fourth process, refer to FIG. 5] Rapid thermal oxidation (RTO) is performed to form the thermal oxidation film 6 (first thermal oxidation film) on the inner surface (side surface and bottom surface) of the STI trench 60. The thickness of the thermal oxidation film 6 is adjusted to, for example, approximately 20 nm. RTO is performed in an oxygen atmosphere under a temperature of 1100° C. for about two minutes to form the thermal oxidation film 6. The high temperature heat treatment for forming the thermal oxidation film 6 fluidizes the thermal oxidation film. This rounds each corner of the STI trench 60, that is, forms round surfaces at opening edges 61a and at bottom edges 61b, which are located at the boundary between the side and bottom surfaces. More specifically, in the STI trench 60, the opening edges 61a are smoothed into a convex surface, and the bottom edges 61b are smoothed into a concave surface. RTO enables the thermal oxidation film 6 to be formed under a high temperature within a short period. This facilitates the formation of the rounded opening edges 61a and bottom edges 61b and prevents diffusion of impurities from the N$^+$ embedment layer 2.

Figure 6:
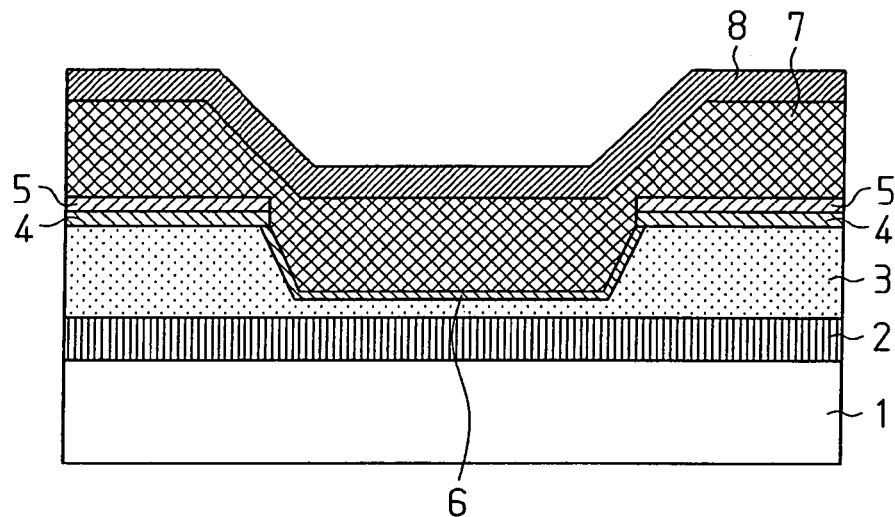

[Fifth process, refer to FIG. 6] High density plasma CVD (HDP-CVD) is performed to form the HDP-NSG film 7 so as to completely fill the STI trench 60. The thickness of the HDP-NSG film 7 is adjusted to, for example, approximately 600 nm.

[Sixth process, refer to FIG. 6] Low pressure CVD is performed under a temperature of 800° C. to form a high-temperature oxide (HTO) film 8. The thickness of the HTO film 8 is adjusted to, for example, approximately 300 nm. The HTO film 8 is superior to the HDP-NSG film 7 from the viewpoint of step coverage. However, the HDP-NSG film 7 is superior to the HTO film 8 from the viewpoint of embedment characteristics. Thus, the HDP-NSG film 7 fills the STI trench 60 in a satisfactory manner.

Figure 7:
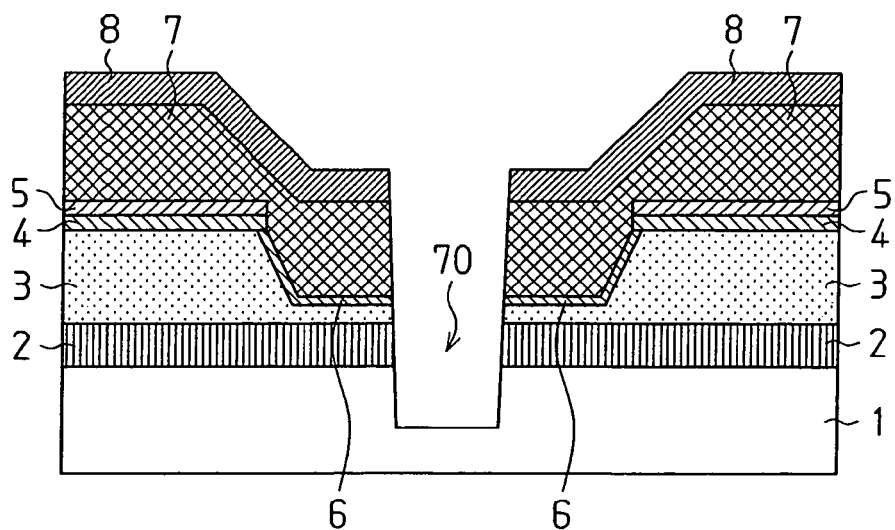

[Seventh process, refer to FIG. 7] After formation of the HTO film 8, lithography is performed to form a resist pattern mask on the HTO film 8 at a predetermined region. Dry etching is performed with the resist pattern mask to pattern the HTO film 8 and the HDP-NSG film 7. Subsequently, the resist pattern mask is removed (not shown).

Dry etching is performed on the N-type epitaxial layer 3, the N+ embedment layer 2, and the P-type silicon substrate 1 using the patterned HTO film 8 and the HDP-NSG film 7 as a hard mask to form the deep trench 70, which partitions the N+ embedment layer 2, as shown in FIG. 7. The dry etching thins the HTO film 8. The deep trench 70 is formed so that its bottom is located at a depth of approximately 6 μm from the upper surface of the N-type epitaxial layer 3. In this manner, the deep trench 70 is formed so that it is deeper than the STI trench 60.

Figure 8:
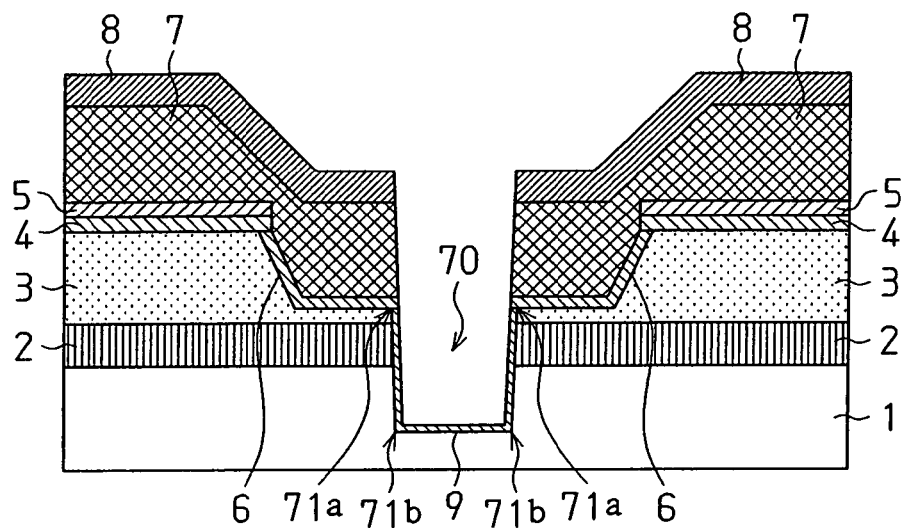
Figure 14:
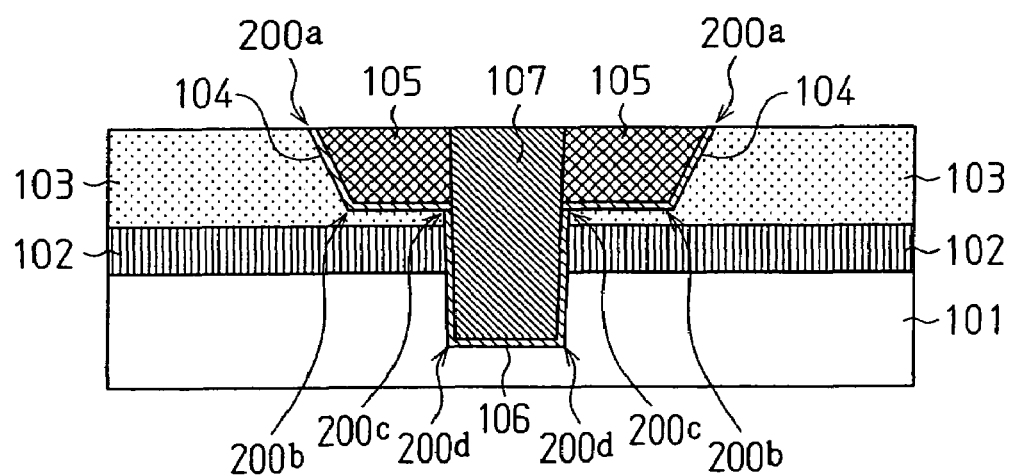
FIG. 14 is a cross-sectional view showing a semiconductor device including an element isolating region formed by performing the STI technique in the prior art.

[Eighth process, refer to FIG. 8] RTO is performed to form the thermal oxidation film 9 on the inner surface of the deep trench 70. The thickness of the thermal oxidation film 9 is adjusted to, for example, about 10 nm. In comparison with the prior art heat treatment in which the thermal oxidation films 104 and 106 shown in FIG. 14 have the same thickness, RTO is performed with less heat so that the thermal oxidation film 9 in the deep trench 70 is thinner than the thermal oxidation film 6 in the STI trench 60. RTO, which uses a small quantity of heat, reduces the diffusion of impurities from the N+ embedment layer 2 and decreases stress resulting from the formation of the thermal oxidation film 9 in the deep trench 70.

During the formation of the thermal oxidation film 9, the N+ embedment layer 2, which has a high impurity concentration, is directly exposed from the deep trench 70. The thermal oxidation film 9 of the deep trench 70 is thin so as to reduce the diffusion of impurities from the N+ embedment layer 2 and out of the deep trench 70. The thin thermal oxidation film 9 is formed by performing RTO with a small quantity of heat. This easily reduces the diffusion of impurities from the N+ embedment layer 2 and maintains the concentration of impurities in the N+ embedment layer 2 so as to prevent the collector resistor from increasing.

Figure 9:
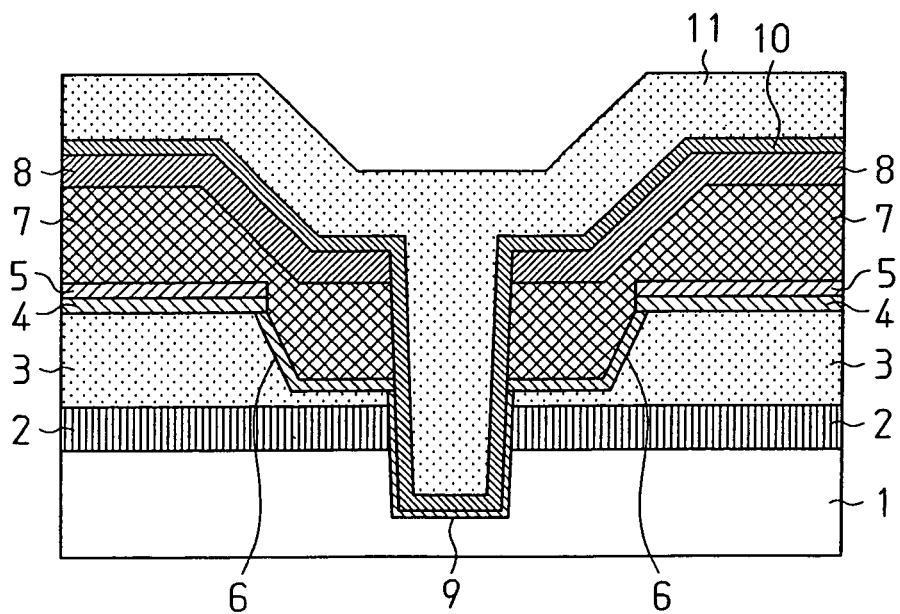

[Ninth process, refer to FIG. 9] CVD is performed to form the silicon oxidation film 10 with a thickness of approximately 300 nm. Then, CVD is performed to form the polysilicon film (poly-Si film) 11 so as to completely fill the deep trench 70. The thickness of the polysilicon film 11 is adjusted to, for example, approximately 800 nm. The thermal oxidation film 9 and the silicon oxidation film 10 function as an electric insulator between the polysilicon film 11 and each of the N-type epitaxial layer 3, the N+ embedment layer 2, and the P-type silicon substrate 1.

Figure 10:
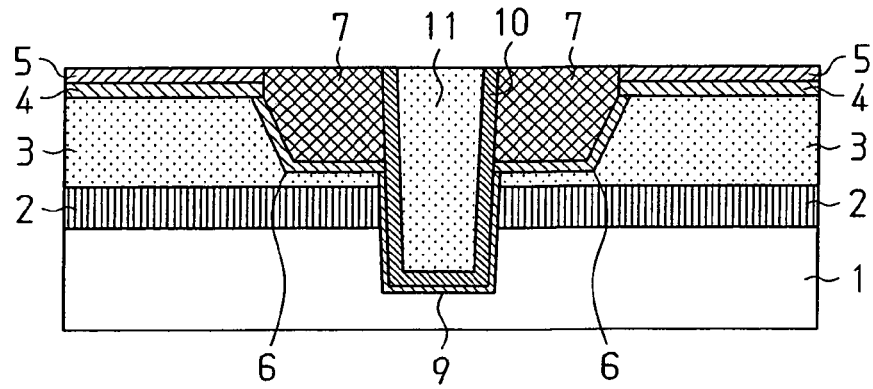

[Tenth process, refer to FIG. 10] CMP is performed to simultaneously polish and remove unnecessary depositions from the polysilicon film 11, the silicon oxidation film 10, the HTO film 8, and the HDP-NSG film 7. The silicon nitride film 5 functions as a stopper film when polishing is performed during CMP.

Figure 11:
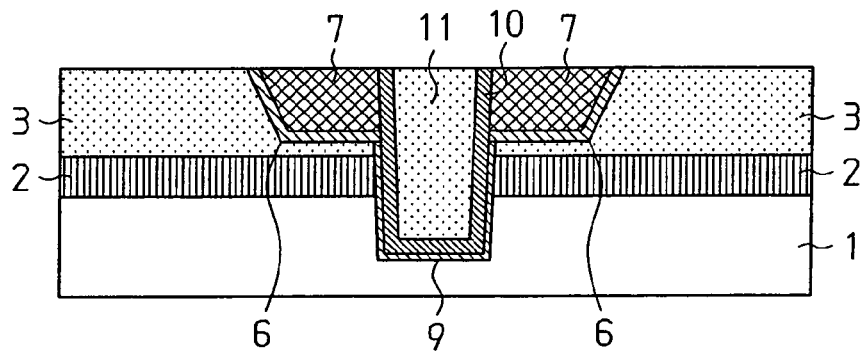

[Eleventh process, refer to FIG. 11] The silicon nitride film 5 is eliminated by phosphoric acid heated to approximately 160° C. Then, the silicon oxidation film 4 is eliminated by diluted hydrofluoric acid (HF).

Figure 12:
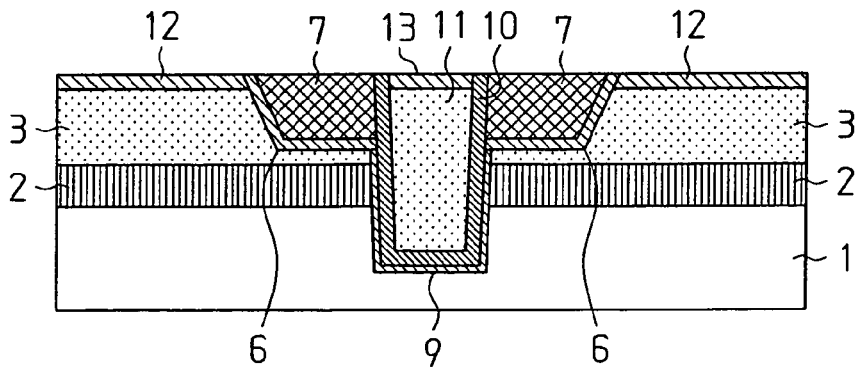

[Twelfth process, refer to FIG. 12] Thermal oxidation is performed to form the silicon oxidation film 12, while partially oxidizing the upper surface of the polysilicon film 11 in the deep trench 70 to form the trench cap layer 13, which is formed by a silicon oxidation film. RTO is performed as a heat treatment that forms the silicon oxidation film 12 and the trench cap layer 13 within a short period of time. This suppresses the diffusion of impurities from the N+ embedment layer 2.

In this manner, the element isolating region having a flat upper surface is completed. The element isolating region isolates the element formation region 50, on which a semiconductor element such as a bipolar transistor is formed.

Referring to FIG. 1, the base electrodes 14, the silicon oxidation films 15 (insulative films) covering the base electrodes 14, and the emitter electrode 16 are formed on the element formation region 50 to form the bipolar transistor.

Figure 13:
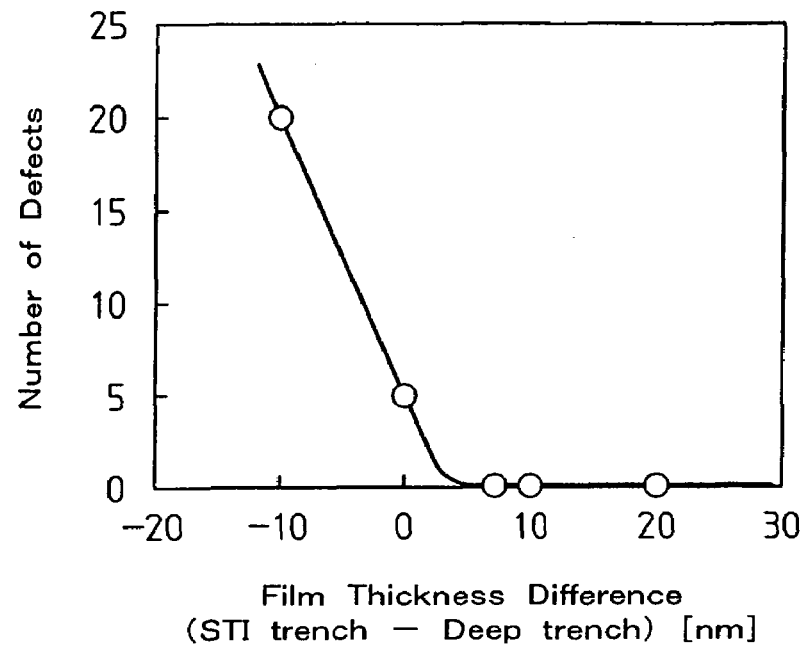
FIG. 13 is a graph showing the relationship between the number of defects and the difference of the thickness of a thermal oxidation film of the STI trench and the thickness of a thermal oxidation film of the deep trench.

Table 1 and FIG. 13 show the number of defects that occurred when varying thickness of the thermal oxidation film 6 in the STI trench 60 and the thickness of the thermal oxidation film 9 in the deep trench 70. A defect evaluation was performed by counting the number of defects per 1 μm² in the vicinity of the STI trench 60 with a cross-section SEM after shaping the cross-section of the semiconductor device in the required manner.

TABLE 1

| Condition | Thermal Oxidation Film Thickness | | Thickness Difference [Thermal Oxidation Film 6 – Thermal Oxidation Film 9] | Number of Defects |
|---|---|---|---|---|
| | Thermal Oxidation Film 6 in STI Trench 60 | Thermal Oxidation Film 9 in Deep Trench 70 | | |
| A | about 0 nm | 10 nm | −10 nm | 20 |
| B | 10 nm | 10 nm | 0 nm | 5 |
| C | 10 nm | 4 nm | 6 nm | 0 |
| D | 10 nm | about 0 nm | 10 nm | 0 |
| E | 20 nm | 10 nm | 20 nm | 0 |

When the film thickness of the deep trench with respect to that of the STI trench was relatively large (condition A) or about the same (condition B) as in the prior art semiconductor device, defects were observed in the N-type epitaxial silicon layer 103 starting from the corners 200b in the STI trench. When the film thickness of the deep trench 70 with respect to that of the STI trench 60 was small (conditions C, D, and E) as in the semiconductor device of the preferred embodiment, defects were not observed. The semiconductor device had superior transistor characteristics especially under condition E.

It is apparent from the graph of FIG. 13 that the number of defects decreased as the film thickness of the deep trench 70 became smaller than that of the STI trench 60. It is also apparent that defects do not occur when the difference between the thickness of the thermal oxidation film in the STI trench 60 and the thickness of the thermal oxidation film in the deep trench 70 is 6 nm or greater.

The semiconductor device of the preferred embodiment has the advantages described below.

The STI trench and the deep trench 70 have rounded corners. This mainly mitigates stress acting in the <111> direction and suppresses the occurrence of defects especially at the opening edge 61a of the STI trench 60, the boundary edge 71a between the STI trench 60 and the deep trench 70, and the bottom edge 71b of the trench 70. Further, the second oxidation film 9 is formed thinner than the first oxidation film 6 so as to mitigate stress especially at the boundary edge 71a between the STI trench 60 and the deep trench 70.

When the first embedment film 7 and the second embedment film 11 are formed from different materials (coefficient of thermal expansions), the boundary edges 71 would be apt to receiving stress due to the heat applied to each layer during the formation of semiconductor elements. Further, since it is difficult to round the boundary edge 71a, it would be difficult for stress to be released. However, in the preferred embodiment, the second oxidation film 9 is formed thinner than the first thermal oxidation film 6. This absorbs stress with the thermal expansion difference between the first embedment film 7 and the second embedment film 11 so as to suppress the occurrence of defects at the boundary edge 71*a*.

It should be apparent to those skilled in the art that the present invention may be embodied in many other specific forms without departing from the spirit or scope of the invention. Particularly, it should be understood that the present invention may be embodied in various types of bipolar transistors.

The present invention may also be applied to a semiconductor device including a bipolar transistor and a MOS transistor and to a method for manufacturing such a transistor.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   an element isolating region;
   a semiconductor substrate;
   a first layer including impurities formed on the semiconductor substrate;
   a first trench formed in the element isolating region, the first trench including an inner surface having a rounded corner;
   a first thermal oxidation film formed on the inner surface of the first trench;
   a first embedment layer formed in the first trench;
   a second trench formed in the first trench and extending into the first embedment layer, the first thermal oxidation film, the first layer, and the semiconductor substrate, the second trench including an inner surface having a rounded corner and being deeper than the first trench;
   a second thermal oxidation film, which is different from the first thermal oxidation film, formed on the inner surface of the second trench, and the second thermal oxidation film covering a surface of the first layer in the second trench and being thinner than the first thermal oxidation film;
   a second embedment film filling the second trench;
   an oxidation film formed in the second trench between the second thermal oxidation film and the second embedment film;
   an element region isolated on the semiconductor substrate by the first trench and the second trench; and
   a semiconductor element formed on the element region.

2. The semiconductor device according to claim 1, wherein thickness difference between the thickness of the first thermal oxidation film and the thickness of the second thermal oxidation film is 6 nm or greater.

3. The semiconductor device according to claim 1, wherein the corner of the first trench includes an opening edge of the first trench and a bottom edge of the first trench.

4. The semiconductor device according to claim 3, further comprising:
   a second layer formed on the first layer, the opening edge and the bottom edge of the first trench being located in the second layer.

5. The semiconductor device according to claim 1, wherein the corner of the second trench includes at least a bottom edge of the second trench.

6. The semiconductor device according to claim 5, wherein the bottom edge of the second trench is located in the semiconductor substrate.

7. The semiconductor device according to claim 1, wherein the oxidation film is a silicon oxidation film.

8. The semiconductor device according to claim 1, wherein the first thermal oxidation film has a first controlled thickness and the second thermal oxidation film has a second controlled thickness.

9. The semiconductor device according to claim 1, wherein the first thermal oxidation film and the second thermal oxidation film are formed in mutually different manufacturing steps.

* * * * *